United States Patent
Huglin et al.

(10) Patent No.: US 7,524,756 B2
(45) Date of Patent: Apr. 28, 2009

(54) PROCESS OF FORMING A SEMICONDUCTOR ASSEMBLY HAVING A CONTACT STRUCTURE AND CONTACT LINER

(75) Inventors: Grant S. Huglin, Boise, ID (US); Robert J. Burke, Boise, ID (US); Sanh D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 71 days.

(21) Appl. No.: 11/495,438

(22) Filed: Jul. 28, 2006

(65) Prior Publication Data

US 2006/0276035 A1    Dec. 7, 2006

Related U.S. Application Data

(62) Division of application No. 10/925,527, filed on Aug. 24, 2004, now Pat. No. 7,170,174.

(51) Int. Cl.
*H01L 21/4763* (2006.01)
(52) U.S. Cl. .............. 438/629; 438/637; 438/639; 438/642; 438/648; 438/675

(58) Field of Classification Search ............... 438/672, 438/675, 687; 257/758, 774
See application file for complete search history.

(56) References Cited

U.S. PATENT DOCUMENTS

| | | | |
|---|---|---|---|
| 6,404,058 B1 | 6/2002 | Taguwa | 257/770 |
| 6,518,626 B1 | 2/2003 | Moore | 257/344 |
| 6,680,514 B1 | 1/2004 | Geffken et al. | 257/368 |
| 6,846,741 B2 * | 1/2005 | Cooney et al. | 438/638 |
| 6,977,437 B2 | 12/2005 | Griffin et al. | 257/758 |
| 7,067,920 B2 | 6/2006 | Ishihara | 257/758 |
| 7,224,068 B2 * | 5/2007 | Tseng et al. | 257/774 |
| 2003/0141597 A1 | 7/2003 | Houston et al. | 257/758 |

* cited by examiner

*Primary Examiner*—Zandra Smith
*Assistant Examiner*—Khanh B Duong

(57) ABSTRACT

A contact structure and a method of forming thereof for semiconductor devices or assemblies are described. The method provides process steps to create a contact structure encompassed by a sacrificial contact medium having an opening therein that is lined with a conductive spacer liner that effectively prevents the contact structure from being damaged during removal of the surrounding sacrificial contact medium material. The sacrificial contact medium is then replaced with a non-boron doped dielectric material.

14 Claims, 5 Drawing Sheets

US 7,524,756 B2

PROCESS OF FORMING A SEMICONDUCTOR ASSEMBLY HAVING A CONTACT STRUCTURE AND CONTACT LINER

This application is a divisional to U.S. patent application Ser. No. 10/925,527, filed Aug. 24, 2004 now U.S. Pat. No. 7,170,174.

FIELD OF THE INVENTION

This invention relates to semiconductor fabrication processing and, more particularly, to a method for forming a contact structure liner for semiconductor devices, such as static random access memories (SRAMS) or dynamic random access memories (DRAMs).

BACKGROUND OF THE INVENTION

The continuing trend of scaling down integrated circuits has motivated the semiconductor industry to consider new techniques for fabricating precise components at sub-micron levels. One important area in semiconductor fabrication is forming the interconnecting structure within the integrated circuit and particularly connections between various levels of metal layers.

As is the case for most semiconductor integrated circuitry, circuit density is continuing to increase at a fairly constant rate. In semiconductor devices it may be advantageous to build contact plugs for interlayer connections having high aspect ratio structures, as circuit density will be enhanced. In that light, it becomes critical that the contact structure, particularly were the structure makes physical contact to an underlying conductor, is not damaged during processing.

Forming contact plugs to regions in a semiconductor device are well known. For example, U.S. Pat. No. 6,518,626 describes a method to form a self-aligned contact to a source/drain region of a transistor. The contact is fabricated between transistor gate stacks having sidewall spacers, often formed of an oxide or nitride. The process includes forming an insulating layer, for example an oxide such as BPSG, over the gate stacks and etching through the insulating layer. The sidewall spacers on the gate stack protect the gate stack and allow for lateral margin during the etching process. The etching process, however, does remove some of the sidewall spacer. As the thickness of the spacer decreases with advances in semiconductor designs, removal of a portion of the spacer can create short circuits between the transistor gate stack and the conductive contact plug.

The present invention describes a contact structure and a method to form the contact structure that addresses the above challenges.

SUMMARY OF THE INVENTION

Exemplary implementations of the present invention include a contact structure and a method of forming thereof for semiconductor devices or assemblies. The method provides process steps to create a contact structure encompassed by a sacrificial contact medium having an opening therein that is lined with a protective spacer liner that effectively prevents the contact structure from being damaged during removal of the surrounding sacrificial contact medium material. The sacrificial contact medium is then replaced with a non-boron doped dielectric material.

DETAILED DESCRIPTION OF THE INVENTION

Exemplary implementations of the present invention are directed to contact structures and processes for forming a self-aligned contact plug having protective liners and being encompassed by a non-boron containing dielectric for fabrication of semiconductor assemblies, such as a semiconductor device as depicted in the embodiments of FIGS. 1-8. The present invention is described herein with reference to a contact made to an active device, such as a field effect transistor, but can be implemented in stand alone, or discrete contacts.

In the following description, the terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-saphire, germanium, or gallium arsenide, among others.

Figure 1:
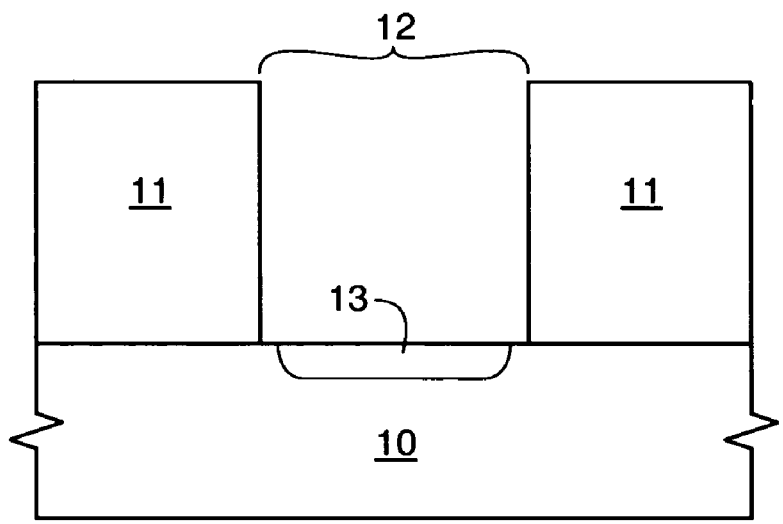
FIG. 1 is a cross-sectional view of a semiconductor substrate section depicting a sacrificial self-aligned contact medium on a substrate assembly.

Referring now to FIG. 1, substrate 10, such as a semiconductor assembly, is prepared for processing steps of an embodiment of the present embodiment. Residing in substrate 10 is a conductive material or a semiconductive region 13, such as a metal layer, a source/drain of a transistor implanted into a conductively doped silicon wafer or a metal silicide, such as titanium silicide ($TiSi_2$).

A sacrificial self-aligned contact medium 11, such as borophosphosilicate glass (BPSG) is placed on substrate 10 and subsequently patterned to provide a defined contact opening location (via) 12, which exposes conductor 13 residing in a portion of substrate 10. It is preferred that sacrificial contact medium 11 be an insulative material rather than a conductive material so that a subsequent removal of the sacrificial contact medium 11 surrounding a subsequently formed adjacent conductive material is easily accomplished by methods known to those skilled in the art in that the sacrificial (insulative) material 11 is removed without removing the adjacent conductive material.

Figure 2:
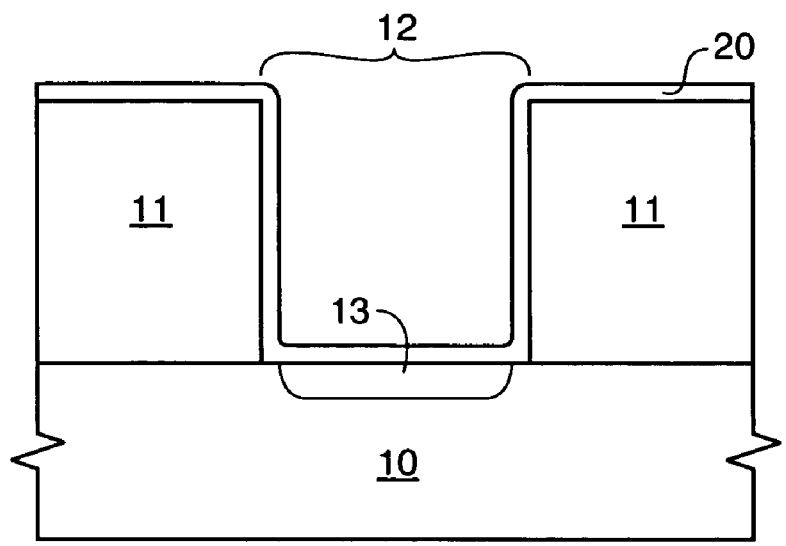
FIG. 2 is a subsequent cross-sectional view taken from FIG. 1 following the formation of a sacrificial liner material over the sacrificial self-aligned contact medium and the exposed portion of the substrate assembly.

Referring now to FIG. 2, a self-aligned contact liner material 20, for example a metal material, and more particularly a preferred metal, namely tungsten, is formed to cover sacrificial self-aligned contact medium 11 (conforming to both the horizontal and vertical components of medium 11) and the exposed portion of substrate 10.

Figure 3:
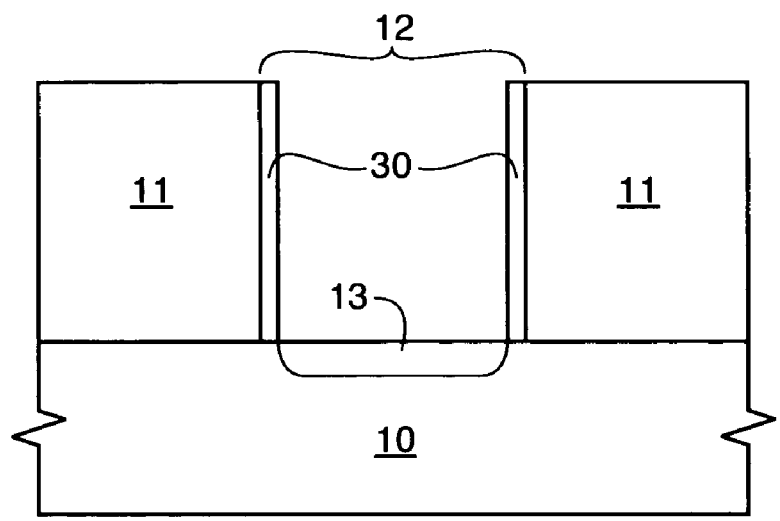
FIG. 3 is a subsequent cross-sectional view taken from FIG. 2 following the removal of the sacrificial liner material to leave a liner material portion on the vertical surfaces of the sacrificial self-alignment contact medium.
Figure 6:
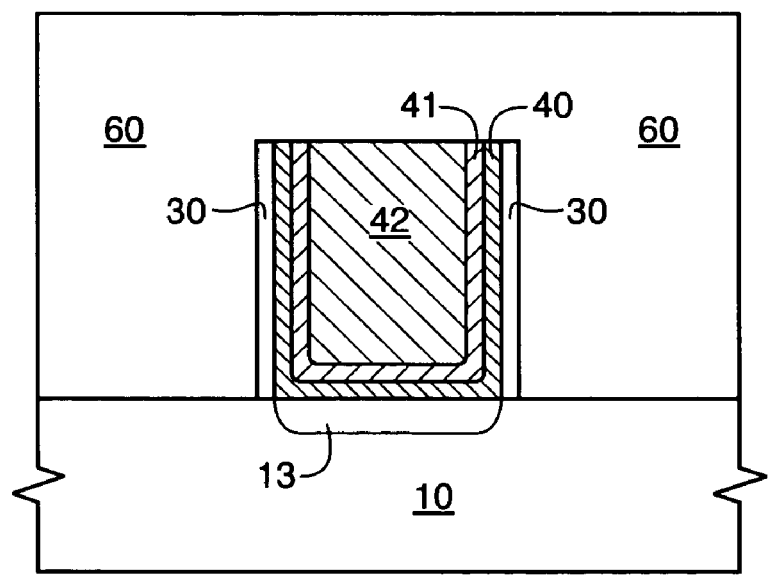
FIG. 6 is a cross-sectional view taken from FIG. 5 following the formation of a sacrificial self-alignment contact medium replacement material.

Referring now to FIG. 3, the liner material 20 is selectively removed by methods known to one skilled in the art, such that a vertical component of the liner material remains to form conductive vertical liner spacer 30 residing on the vertical sidewalls of medium 11, while the horizontal components are removed to expose underlying conductor 13. Conductive vertical liner spacer 30 will also serve as barrier layer to limit the amount of out-diffusion of heavy conductive atoms, such as boron, from neighboring doped insulation material subsequently formed as depicted in FIG. 6. Ultimately, the doped insulation material formed in the process steps depicted in FIG. 6 will replace sacrificial contact medium 11.

Figure 4:
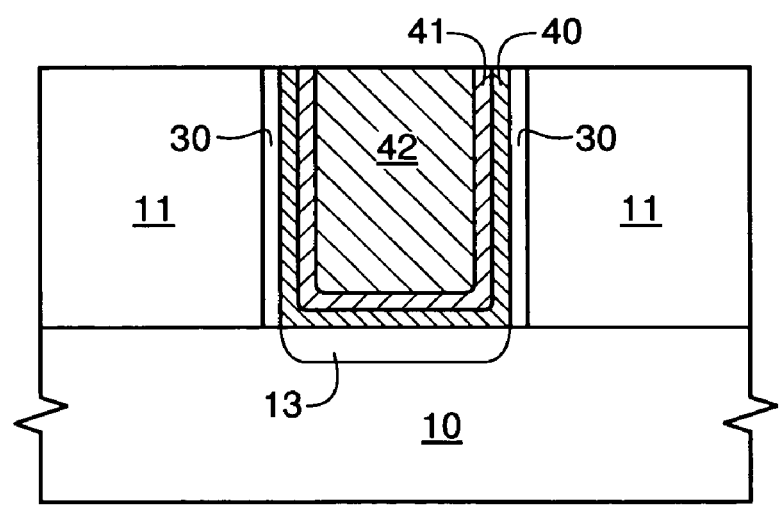
FIG. 4 is a cross-sectional view taken from FIG. 5 following the formation of a barrier material, an adhesion material, and a conductive plug, all of which are planarized.

Referring now to FIG. 4, a second barrier layer 40, such as titanium, an adhesion layer 41, such as titanium nitride, and conductive plug material 42, such as tungsten, are sequentially formed over medium 11 and into via 12. The barrier layer 40 can be a metal layer that will prevent conductive atoms from diffusing through it. The type of metal used for barrier layer 40 will determine the type of adhesion material selected for adhesion layer 41 so that strong atomic bonding occurs between the second barrier layer and the adhesion layer as well as between the adhesion layer and the conductive plug materials. For example, if titanium is selected for second barrier layer 40, then using titanium nitride as the adhesion layer will provide good adhesion between titanium layer 40 and a conductive plug material 42, like tungsten.

Layers 40, 41 and 42 are then subjected to a planarization process known to those skilled in the art, such as chemical mechanical planarization. After the planarization of layers 40, 41 and 42, a self-aligned contact is formed comprising conductive vertical liner spacer 30 (also serves as a diffusion barrier layer), barrier layer 40, adhesion layer 41 and conductive plug material 42. Barrier layer 40 will further limit the amount of out-diffusion of conductive atoms from a neighboring doped insulation material formed during a given fabrication process.

Though FIG. 4 depicts three layers to form a self-aligned contact, any number of layers may be formed as required in a given process to form a contact. For example, although described in the exemplary embodiment of the present invention, barrier layer 40 and adhesion layer 41 are optional materials and need not be present as conductive vertical liner spacer 30 and conductive plug material 42 will suffice as the conductor if so desired, without departing from the intent of the present invention.

Figure 5:
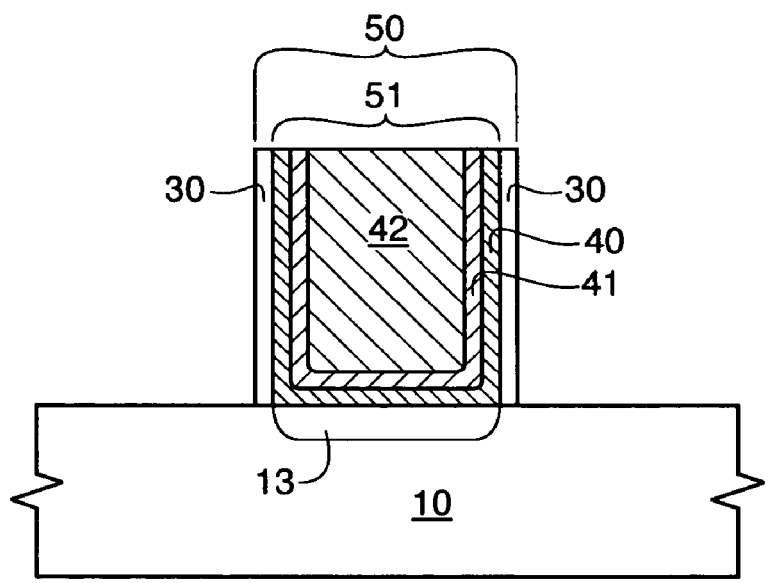
FIG. 5 is a cross-sectional view taken from FIG. 4 following the removal of the sacrificial self-alignment contact medium.

Referring now to FIG. 5, medium 11 is removed by such methods as wet/dry/vapor etch techniques, or any combinations thereof, know to those skilled in the art. The removal of medium 11 leaves vertical liner spacer 30 intact and residing next to barrier layer 40 to form a structure 50 comprising a contact structure 51 having protective vertical liner spacer 30.

In addition to functioning as an out-diffusion barrier, the presence of the protective spacer 30 also becomes significant during the removal of medium 11 as protective spacer 30 prevents any removal or damage to the underlying conductor 13, should there be any process margin variations associated with smaller device geometries being processed with the current fabrication processes.

Referring now to FIG. 6, a self-aligned contact medium replacement material 60 is formed over the semiconductor assembly such that replacement material 60 covers substrate 10 and structure 50. For example, replacement material 60 may comprise such materials as phosphosilicate glass (PSG) or other non-boron containing dielectrics, as boron atoms (such as B10) are known to diffuse into neighboring materials and degrade the electrical characteristics of active devices, such as field effect transistors (FETs). Also, as mentioned previously, it is desired that a barrier layer be in place to limit the diffusion of heavy conductive atoms, such as boron, should a boron containing dielectric be used. Finally, replacement material 60 may then be planarized in preparation for subsequent process steps used to complete fabrication of a given semiconductor assembly or device.

Figure 7:
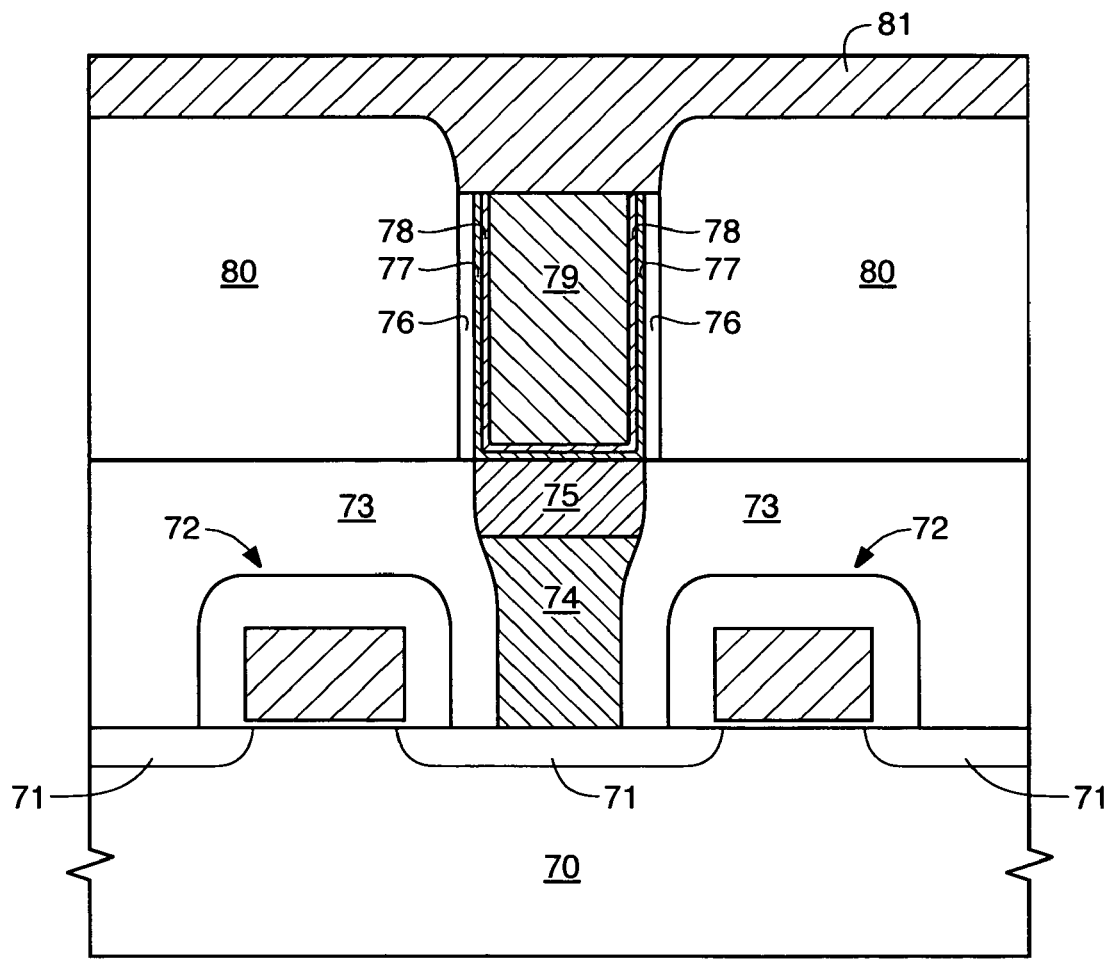
FIG. 7 is cross-sectional view showing a completed interconnect structure between transistor source/drain regions and a self-aligned contact plug depicting an embodiment of the present invention.

FIG. 7 depicts an example of a device utilizing the process steps of the present invention. As shown in FIG. 7, processing steps, known by one skilled in the art, are used to form field effect transistors (FETs) in a silicon substrate 70. The FETs comprise source/drain regions 71 that span between insulated transistor gate electrodes 72. Insulated transistor gate electrodes 72 are typically made up of a transistor gate oxide and conductive layers, such as polysilicon and silicide, respectively, which are isolated by transistor gate cap insulator, made from dielectric materials such as nitride. Insulation material 73 covers the insulated transistor gate electrodes and contact 74 is formed therein that connects between to source/drain region 71 and an overlying conductive material 75. Conductive material 75 represents conductor 13 residing in substrate 10 seen in FIG. 1 and is at the point the processing steps of the present invention are utilized. As described in the process steps of FIGS. 1-6, protective spacer liner 76 is formed into a contact via (or opening), followed by the formation of barrier layer 77, adhesion layer 78 and conductive plug material 79 to form a contact structure. Replacement material 80 insulates the contact structure and an interconnect 81 is formed to connect to the contact structure.

FIG. 7 represents only one example of a type of semiconductor device or assembly the process steps of the present invention may be used for. Though the embodiment of the present invention depicts a device utilizing self-aligned contact technology, the present invention may successfully be used on other technologies, such as any contact, damascene or trench processes know to those skilled in the art.

Figure 8:
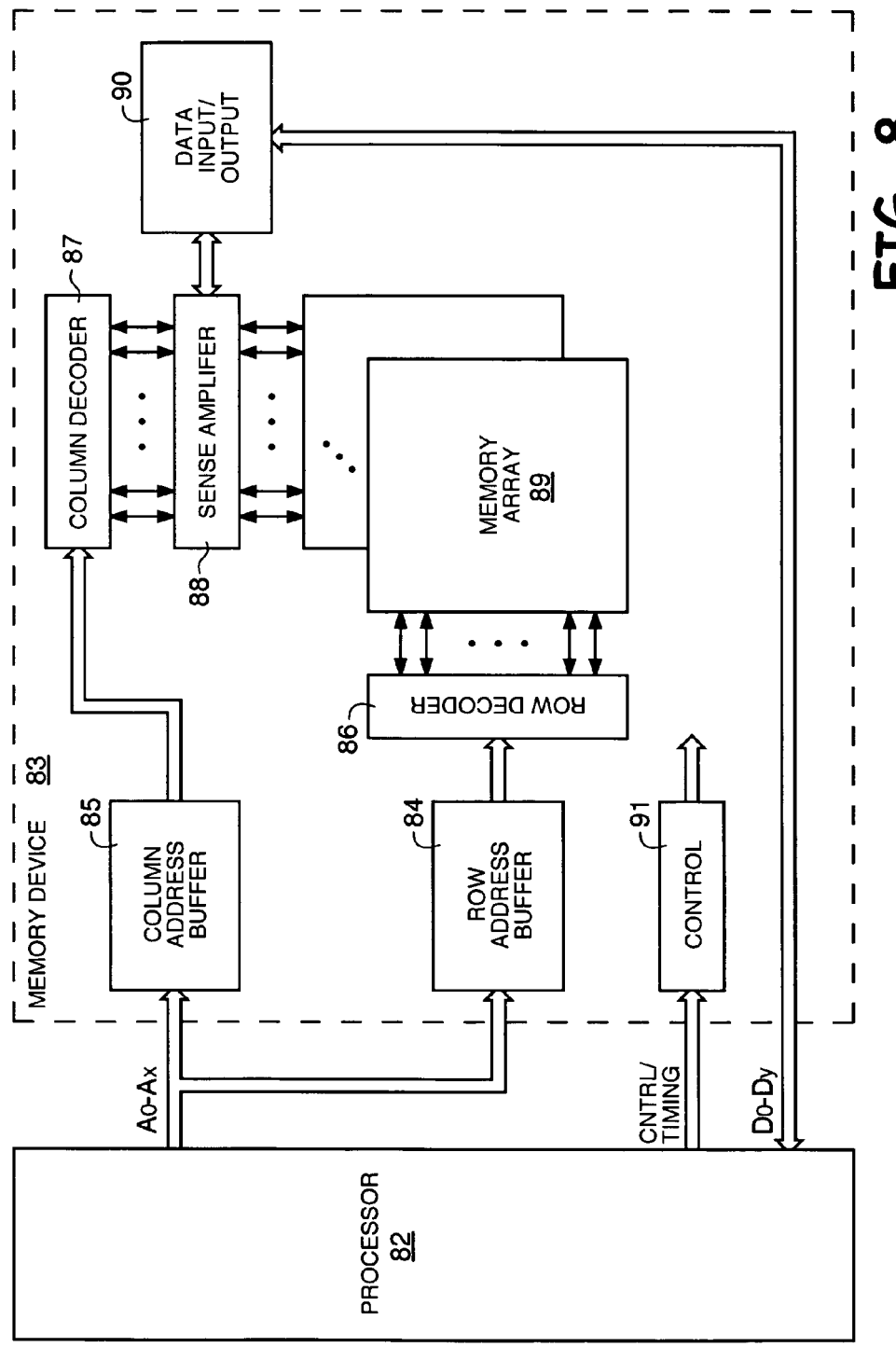
FIG. 8 is a simplified block diagram of a semiconductor system comprising a processor and memory device to which the present invention may be applied.

The self-aligned contact structures and the formation thereof, as described above for development in semiconductor devices, may be applied to a semiconductor system, such as the one depicted in FIG. 8. FIG. 8 represents a general block diagram of a semiconductor system, the general operation of which is known to one skilled in the art, the semiconductor system comprising a processor 82 and a memory device 83 showing the basic sections of a memory integrated circuit, such as row and column address buffers, 84 and 85, row and column decoders, 86 and 87, sense amplifiers 88, memory array 89 and data input/output 90, which are manipulated by control/timing signals from the processor through control 91.

It is to be understood that although the present invention has been described with reference to a preferred embodiment, various modifications, known to those skilled in the art, such as utilizing the disclosed methods to form a protect liner for contacts in any semiconductor device or semiconductor assembly, may be made to the process steps presented herein without departing from the invention as recited in the several claims appended hereto.

What is claimed is:

1. A method of a forming a semiconductor assembly having a contact structure comprising:
    forming a sacrificial contact structure encompassing material having an opening that exposes an underlying conductor;
    forming a conductive vertical liner spacer on sidewalls of the opening in the sacrificial contact structure encompassing material, the conductive vertical liner spacer being substantially removed from the underlying conductor;
    forming a conductive plug material within vertical confines of the conductive vertical liner spacer and covering a horizontal component of the underlying conductor;
    removing the sacrificial contact structure encompassing material; and
    forming a final contact structure encompassing material.

2. The method of claim 1, wherein the conductive plug material is tungsten.

3. The method of claim 1, wherein the conductive vertical liner spacer comprises tungsten.

4. The method of claim 1, wherein the sacrificial contact structure encompassing material comprises a non-boron containing dielectric.

5. The method of claim 4, wherein the non-boron containing dielectric is phosphosilicate glass (PSG).

6. A method of forming a semiconductor assembly having contact structure comprising:
    forming a sacrificial contact structure encompassing material having an opening therein that exposes an underlying conductor;
    forming a conductive vertical liner spacer on sidewalls of the opening in the sacrificial contact structure encompassing material, the conductive vertical liner spacer being substantially removed from the underlying conductor;
    forming a barrier layer lining the conductive vertical liner spacer and a horizontal component of the underlying conductor;
    forming an adhesion layer conformably lining the barrier layer;
    forming a conductive plug material within vertical components the adhesion layer and covering a horizontal component of the adhesion layer;
    removing the sacrificial contact structure encompassing material; and
    forming a final contact structure encompassing material.

7. The method of claim 6, wherein the conductive plug material is tungsten.

8. The method of claim 6, wherein the adhesion layer is titanium nitride.

9. The method of claim 6, wherein the barrier layer is titanium.

10. The method of claim 6, wherein the conductive vertical liner spacer comprises tungsten.

11. The method of claim 6, wherein the sacrificial contact structure encompassing material comprises a non-boron containing dielectric.

12. The method of claim 11, wherein the non-boron containing dielectric is phosphosilicate glass (PSG).

13. A method of forming a contact structure for a semiconductor assembly comprising:
    forming a sacrificial borophophosilicate glass material having an opening therein that exposes an underlying conductor;
    forming a vertical tungsten spacer on sidewalls of the opening in the sacrificial borophophosilicate glass material;
    forming a titanium layer lining the vertical tungsten spacer and a horizontal component of the underlying conductor;
    forming a titanium nitride layer conformably lining the titanium layer;
    forming a tungsten plug material within vertical components the titanium nitride layer and covering a horizontal component of the titanium nitride layer;
    removing the sacrificial borophophosilicate glass material; and
    forming a non-boron containing dielectric material that encompasses the contact structure.

14. The method of claim 13, wherein the non-boron containing dielectric material is phosphosilicate glass (PSG).

* * * * *

UNITED STATES PATENT AND TRADEMARK OFFICE
CERTIFICATE OF CORRECTION

PATENT NO. : 7,524,756 B2
APPLICATION NO. : 11/495438
DATED : April 28, 2009
INVENTOR(S) : Huglin et al.

It is certified that error appears in the above-identified patent and that said Letters Patent is hereby corrected as shown below:

In column 6, line 24, in Claim 13, delete "borophophosilicate" and insert -- borophosphosilicate --, therefor.

In column 6, line 28, in Claim 13, delete "borophophosilicate" and insert -- borophosphosilicate --, therefor.

In column 6, line 37, in Claim 13, delete "borophophosilicate" and insert -- borophosphosilicate --, therefor.

Signed and Sealed this

Twenty-first Day of July, 2009

JOHN DOLL
*Acting Director of the United States Patent and Trademark Office*